US008645743B2

(12) United States Patent
Machnicki et al.

(10) Patent No.: US 8,645,743 B2
(45) Date of Patent: Feb. 4, 2014

(54) MECHANISM FOR AN EFFICIENT DLL TRAINING PROTOCOL DURING A FREQUENCY CHANGE

(75) Inventors: Erik P. Machnicki, San Jose, CA (US); Hao Chen, San Ramon, CA (US); Sanjay Mansingh, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 559 days.

(21) Appl. No.: 12/951,788

(22) Filed: Nov. 22, 2010

(65) Prior Publication Data

US 2012/0126868 A1 May 24, 2012

(51) Int. Cl.
G06F 1/00 (2006.01)

(52) U.S. Cl.
USPC .......................................... 713/500

(58) Field of Classification Search
USPC .......................................... 713/500
See application file for complete search history.

(56) References Cited

U.S. PATENT DOCUMENTS

| 6,839,860 | B2* | 1/2005 | Lin .............................. 713/401 |
| 7,075,333 | B1 | 7/2006 | Chaudhary |
| 7,161,402 | B1 | 1/2007 | Sompur et al. |
| 7,376,043 | B2 | 5/2008 | Murayama |
| 7,472,304 | B2 | 12/2008 | Malekkhosravi et al. |
| 7,573,307 | B2 | 8/2009 | Heragu |
| 7,587,622 | B2 | 9/2009 | Allen |
| 7,642,825 | B2* | 1/2010 | Maeda ........................ 327/158 |
| 7,685,393 | B2 | 3/2010 | Gillingham et al. |
| 7,746,724 | B2 | 6/2010 | Mayer |
| 7,818,601 | B2* | 10/2010 | LaBerge ...................... 713/401 |
| 8,209,562 | B2* | 6/2012 | Defazio et al. ............... 713/500 |
| 2004/0080349 | A1* | 4/2004 | Kawahito et al. ............ 327/158 |
| 2005/0286320 | A1 | 12/2005 | Iwasaki |
| 2008/0043545 | A1 | 2/2008 | Vink et al. |
| 2009/0085623 | A1* | 4/2009 | Schneider et al. ........... 327/161 |
| 2009/0109770 | A1 | 4/2009 | Sugishita |
| 2011/0158005 | A1* | 6/2011 | Tyan et al. ............... 365/189.05 |

OTHER PUBLICATIONS

Search Report in Application No. EP 11189345.9-2206 mailed Feb. 23, 2012.
Search Report and Written Opinion in application No. PCT/US2011/060518 dated Mar. 9, 2012.

* cited by examiner

*Primary Examiner* — Mohammed Rehman
(74) *Attorney, Agent, or Firm* — Lawrence J. Merkel; Meyertons, Hood, Kivlin, Kowert & Goetzel, P.C.

(57) ABSTRACT

An efficient delay locked loop (DLL) training protocol during a frequency change includes an integrated circuit with a memory physical layer (PHY) unit that includes a master DLL and a slave DLL. The master DLL may delay a first reference clock by an amount, and provide a reference delay value corresponding to the delay amount. The slave DLL may delay a second reference clock by a second amount based upon a received configuration delay value. An interface unit may generate the configuration delay value based upon the reference delay value. A power management unit may provide an indication that the frequency of the second reference clock is changing. In response to receiving the indication, the interface unit may generate a new configuration delay value that corresponds to the new frequency using a predetermined scaling value and provide the new configuration delay value to the memory PHY unit.

20 Claims, 4 Drawing Sheets

MECHANISM FOR AN EFFICIENT DLL TRAINING PROTOCOL DURING A FREQUENCY CHANGE

BACKGROUND

1. Technical Field

This disclosure relates to delay locked loops (DLLs), and more particularly to a DLL training protocol during a change in the reference clock frequency.

2. Description of the Related Art

Many types of devices use delay locked loops (DLLs). Typically, a DLL is used to establish and maintain a particular phase relationship with a reference clock or other signal and to provide one or more delayed versions of that reference signal. When a DLL is first powered up, the DLL may enter a training mode to acquire and lock onto a reference signal edge. In addition, in many DLLs the delay line may be set up to provide the required amount of delay and thus a phase offset for the intended application. In some DLLs, the delay line includes a number of delay elements, each providing a particular amount of delay.

Generally, the number of delay elements will not change as long as the reference signal frequency remains the same. However, in situations where the reference clock frequency changes, conventional DLLs will typically have to execute a retraining to lock and to reconfigure/recalculate the number of delay elements to provide the required phase delay. This process can take time. Depending upon the specific application, the retraining time may be unacceptable.

SUMMARY OF THE EMBODIMENTS

Various embodiments of a mechanism for an efficient delay locked loop (DLL) training protocol during a frequency change are disclosed. In one embodiment, an integrated circuit includes a memory physical layer (PHY) unit that includes a master DLL and a slave DLL. The master DLL may be configured to delay a first reference clock by a certain amount, and to provide a reference delay value corresponding to the amount of delay of the first reference clock. The slave DLL may be configured to delay a second reference clock by a second particular amount based upon a received configuration delay value. The integrated circuit also includes an interface unit that is coupled to the memory PHY unit and may be configured to generate the configuration delay value based upon the reference delay value. The integrated circuit also includes a power management unit that is coupled to the interface unit and may be configured to provide an indication that a frequency of the second reference clock is changing to a new frequency. In response to receiving the indication, the interface unit may be configured to generate a new configuration delay value that corresponds to the new frequency using a predetermined scaling value and to provide the new configuration delay value to the memory PHY unit.

Figure 1:
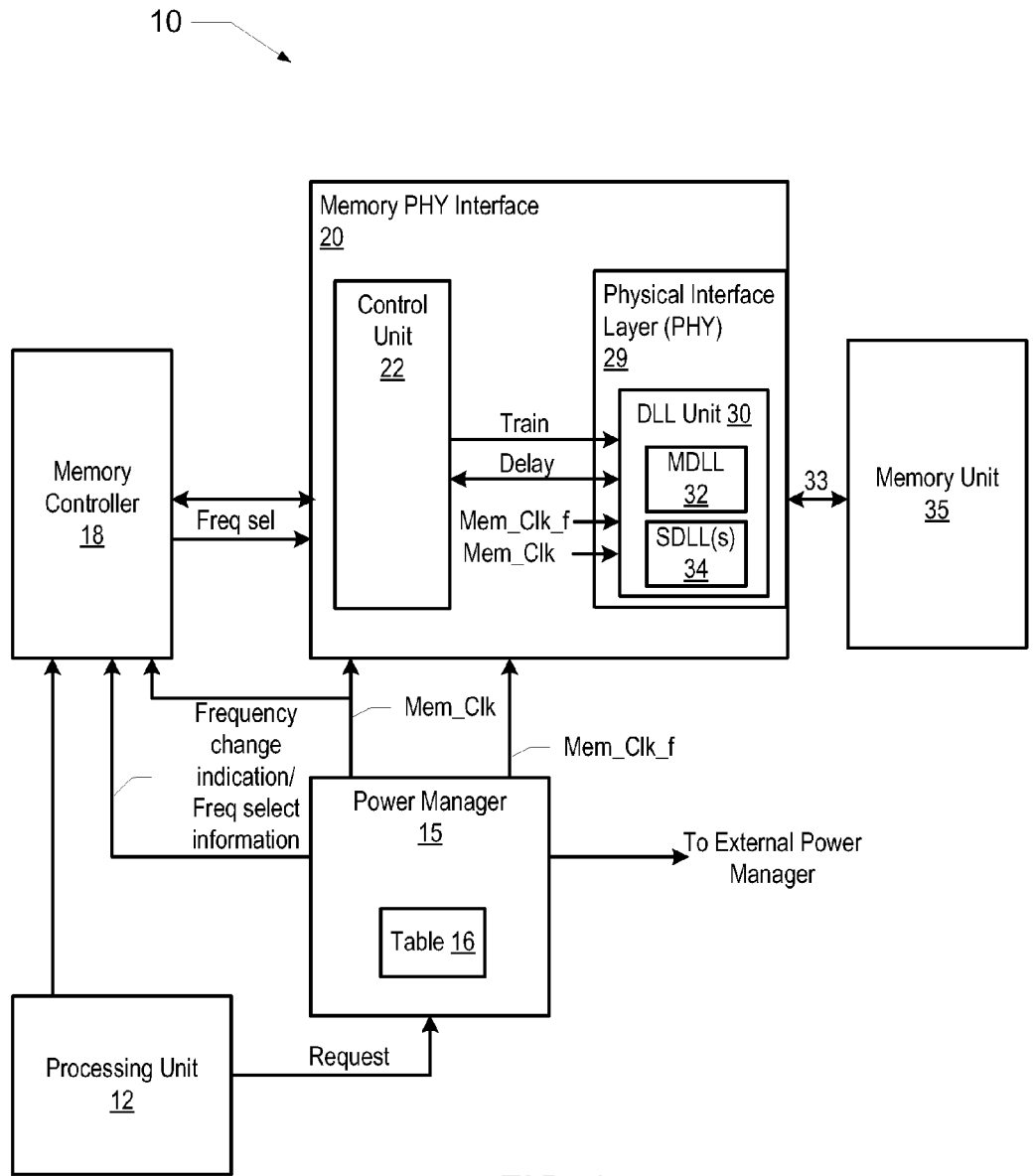
FIG. 1 is a block diagram of one embodiment of an integrated circuit including a memory interface having a DLL and a control unit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of an integrated circuit including a memory interface is shown. The integrated circuit 10 includes a processing unit 12 that is coupled to a power manager 15 and to a memory controller 18. The power manager 15 and the memory controller 18 are also each coupled to a memory PHY interface 20, which is in turn coupled to a memory unit 35 via a memory interconnect 33. In one embodiment, the integrated circuit 10 may be considered as a system on a chip (SOC).

In various embodiments, the processing unit 12 may include one or more processor cores and one or more cache memories (not shown). The processor cores may execute application software as well as operating system (OS) software. The OS may control various features and functions of the integrated circuit. For example, depending on the system performance settings, the OS or other system software may request a change in the frequency of the system clocks, which includes the clocks that drive the memory interconnect 33.

The memory unit 35 may be representative of any type of memory. In one embodiment, the memory device 35 may be representative of one or more random access memory (RAM) memory devices in the dynamic RAM (DRAM) family of devices as described below in conjunction with the description of FIG. 4. Accordingly, the memory interconnect 33 may include a number of data paths, data strobe paths, and address and command paths (all not shown).

In one embodiment, the power manager 15 is configured to provide clocks for use by the components of integrated circuit 10. As shown, the power manager 15 provides the Mem_Clk and the Mem_Clk_f signals to the memory controller 18 and to the memory PHY interface 20, as well as other clock signals to the system. The Mem_Clk signal may be used as the memory system core clock and may be used by the memory controller 18, the memory PHY interface 20 and the memory unit 35. The Mem_Clk_f signal may be used as a training clock by the DLL unit 30 within the memory PHY interface 20.

In one embodiment, the memory PHY interface 20 serves as a control and configuration interface for the physical interface layer (PHY) unit 29. As shown in FIG. 1, the memory PHY interface 20 includes a control unit 22 that is coupled to the PHY 29. The PHY 29 includes a delay locked loop (DLL) unit 30. The DLL unit 30 includes a master DLL (MDLL) 32 that may be configured to acquire and lock onto a particular edge of the reference clock (Mem_Clk_f), and one or more slave DLLs (SDLLs) 34 that may be configured to provide one or more delayed versions of the second reference clock (e.g., Mem_Clk) for use by the memory interconnect 33. More particularly, in one implementation, the MDLL 32 may be used to lock onto Mem_Clk_f and to provide to the control unit 22 a delay value corresponding to the number of delay elements that a delay line of the MDLL 32 uses to delay the Mem_Clk_f signal one full clock cycle. The SDLLs may be used to control clocking on the memory interconnect 33. In particular, the SDLLs 34 may provide clock signals having a phase offset which may be used to place data strobes in the center of the clock window of the memory interconnect 33. In one implementation, the phase offset may be 90-degrees, although in other embodiments, other phase offsets may be used. Each of the SDLLs 34 may be configured to provide the particular phase offset based upon a delay value that corresponds to the number of delay elements used in each respective delay line of each SDLL 34.

In one embodiment, the control unit 22 may be configured to control the operation of DLL unit 30. In one embodiment, control unit 22 may use control registers and a look up table (both shown in FIG. 2) to control operations such as training of the MDLL 32 and configuration of the phase delay of each of the SDLLs 34. In one embodiment, the control unit 22 may provide the train signal to the MDLL 32 at particular intervals. In addition, the control unit 22 may provide the delay values to the SDLLs 34 to generate clocks with the correct phase offset.

In addition, as described further below, the power manager 15 may change the frequency of one or more of the system clocks in response to a system request. The power manager 15 may provide a frequency change indication and frequency information from, for example, table 16 to the memory controller 18 in response to a request from the processor 12. In response to detecting an assertion of the frequency change indication, the memory controller 18 may initiate a handshake with the power manager 15 to ensure a smooth transition to the new frequency. It is noted that an asserted signal refers to a signal that transitions to its active state. More particularly, if a signal is an active low signal, then it is considered to be asserted when the signal level is at a logic low level. Conversely, if a signal is an active high signal, then it is considered to be asserted when the signal level is at a logic high level.

If a frequency change is requested by the system software or OS, the memory controller 18 may be required to quiesce the memory interconnect 33 prior to allowing a frequency change to occur. More particularly, the system software or OS may notify the power manager 15, which in turn asserts the frequency change request indication to the memory controller 18. As part of the handshake, and in response to the request the memory controller 18 may wait until all in-flight memory transactions have completed, prepare the memory unit by precharging banks, and draining refreshes, for example. The memory controller 18 may not start any new memory transactions to memory unit 35 after acknowledging the request. The power manager 15 may initiate the frequency change by changing the frequency and providing the memory controller 18 with frequency select information that corresponds to the new frequency. Once the frequency change has been changed, the power manager 15 may deassert the request, and the memory controller 18 may acknowledge the deassertion. Since the memory interconnect 33 remains idle until the frequency change is complete, the faster the MDLL 32 and the SDLLs 34 are able to provide stable clocks during the frequency change, the faster the memory interconnect 33 may be usable again.

Accordingly, as described in greater detail below in conjunction with the description of FIG. 2 and FIG. 3 in an effort to reduce the time required to change the clock frequency of the memory interconnect 33, in one embodiment the power manager 15 may provide the Mem_Clk_f signal as a fixed frequency training clock signal that does not change, thereby removing the necessity of retraining the MDLL 32 in response to a frequency change. In one implementation, the frequency of the Mem_Clk_f signal may be set at the highest memory clock frequency. In addition, the control unit 22 may use the frequency select information that was provided by the power manager 15 through the memory controller 18 to access a look-up table (shown in FIG. 2), and to use values therein to update the delay values of the SDLLs 34 for the new frequency without having to retrain the SDLLs 34. It is noted that although the Mem_Clk_f signal is fixed in one embodiment, it is contemplated that in other embodiments, the Mem_Clk_f signal may not be a fixed frequency clock signal and may be changed during a frequency change.

Figure 2:
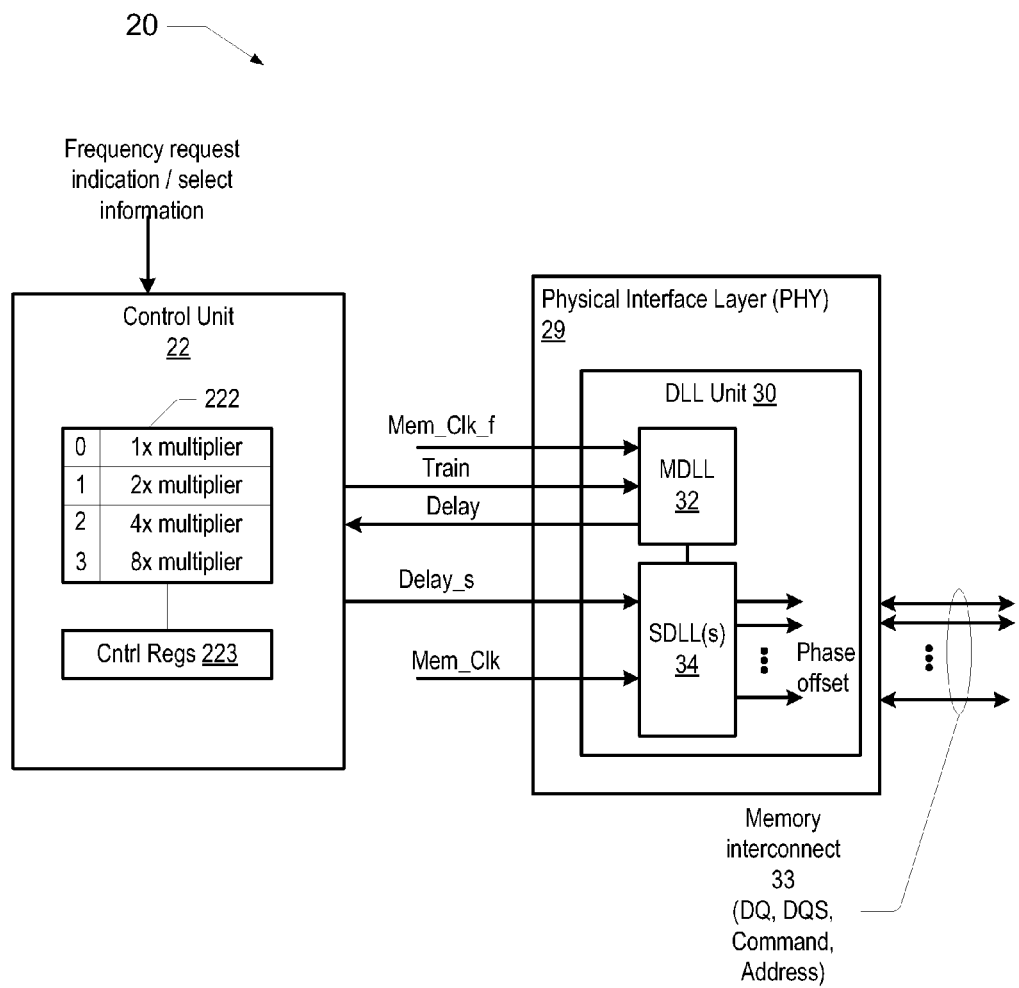
FIG. 2 is a block diagram illustrating more detailed aspects of an embodiment of the memory interface shown in FIG. 1.

Referring to FIG. 2, a block diagram illustrating more detailed aspects of the embodiment of the memory PHY interface 20 of FIG. 1 is shown. Components that correspond to those shown in FIG. 1 are numbered identically for clarity and simplicity. The memory PHY interface 20 includes the control unit 22, which in turn includes a lookup table 222 and control registers 223. The memory PHY interface 20 also includes the PHY 29, which includes the DLL unit 30. As shown, the DLL unit 30 includes an MDLL 32, and one or more SDLLs 34. The PHY 29 provides the physical layer signaling to the memory interconnect 33. As shown, the SDLLs 34 provide one or more clocks having a phase offset, which may be used by logic within the PHY 29 to provide data strobes (e.g., DQS).

As described above, the control unit 22 may receive the frequency selection signal from the memory controller 18, and in one embodiment, the frequency request indication. The frequency selection signal may indicate the frequency domain in which the memory controller 18 is operating. In one embodiment, there are four frequency domains. The four domains include domain 0 which corresponds to the maximum nominal frequency of the memory controller 18 and memory unit 35; domain 1 which corresponds to approximately half of the maximum frequency; domain 2 which corresponds to approximately half of the frequency of domain 1; and domain 3 which corresponds to approximately half of the frequency of domain 2. In one implementation, the domain 0 frequency may be 400 MHz. It is noted that in other embodiments, other numbers of frequency domains and different frequencies may be used.

As shown, the lookup table 222 includes four entries. Each entry corresponds to a frequency domain. Accordingly, in the illustrated embodiment each entry includes two fields, a domain field and a multiplier or "scaling value" field. In one embodiment, logic within the control unit 22 may use the frequency selection signal to index into the lookup table 222. The multiplier field in each entry may be used by the control unit 22 to generate delay values for the SDLLs 34. For example, if the memory controller 18 is operating in domain 0 and thus 400 MHz, the multiplier is a 1× multiplier. The control unit 22 uses the MDLL lock value that is returned by the MDLL 32 to calculate the number of delay elements that the SDLLs 34 should use to provide the correct phase offset and center the strobes (e.g., delay_s). More particularly, the MDLL lock or "reference" value may be divided by a particular number to obtain a base delay or base phase offset value at the base frequency of the MDLL. Then that reference delay is scaled for the frequency domain that the system is operating in. For example, to obtain a 90-degree offset in domain 0, the control unit 22 may divide the MDLL lock value by four and then apply the multiplier in the table. The 1× multiplier causes the control unit 22 to use the calculated base delay value as is. However, if the memory controller 18 is operating in domain 1, the frequency is one-half of the maximum and so to maintain the same phase offset, the number of delay elements needs to be doubled. Accordingly the multiplier in the domain 1 field is a 2× multiplier. Likewise for the remaining domains. The lookup table 222 may be programmed by system software. In one embodiment, when the lookup table 222 is programmed, the table 16 within the power manager 16 may also be programmed with the same domain values so that the two units are in synchronization with each other. It is noted that in various embodiments lookup table 222 may be implemented using memory such as RAM, or registers, or any type of storage as desired.

In one embodiment, the control unit 22 may affect changes in the PHY 29 by writing to specific registers within the control registers 223. Similarly, when the MDLL 32 locks onto the Mem_Clk_f signal during training and generates the lock value, the control unit 22 may sample and store that value within one of the control registers 223.

Figure 3:
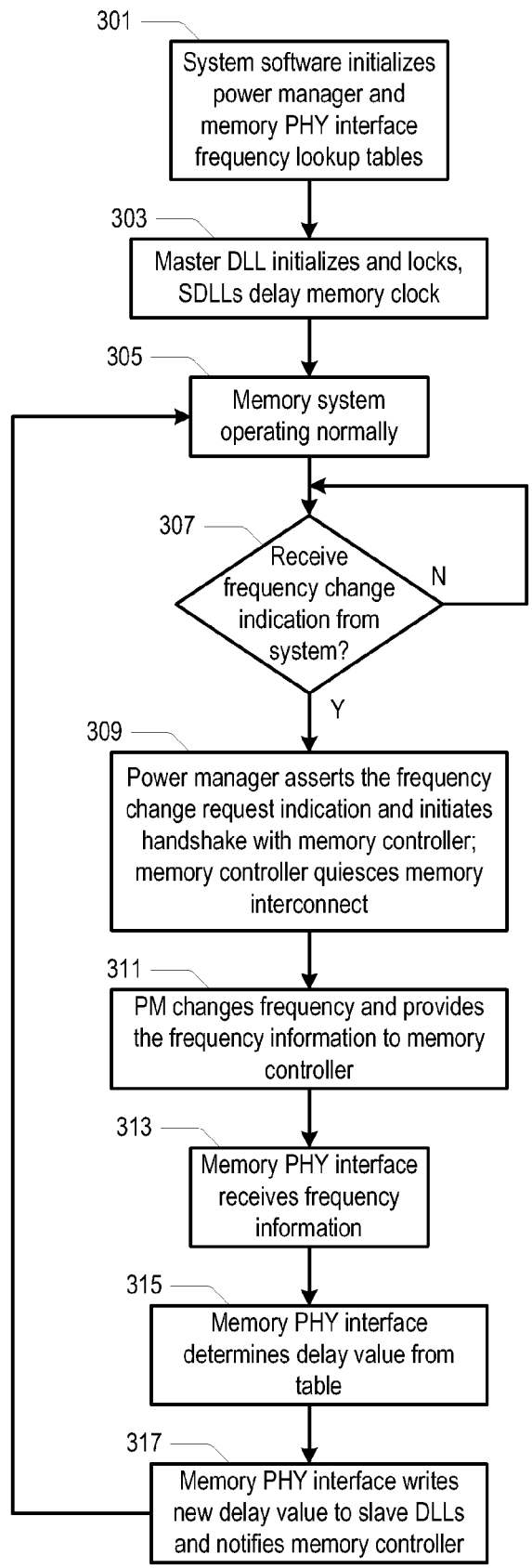
FIG. 3 is a flow diagram describing operational aspects of the memory interface shown in FIG. 1 and FIG. 2.

FIG. 3 is a flow diagram describing operational aspects of the memory interface of FIG. 1 and FIG. 2. Referring collectively now to FIG. 1 through FIG. 3 and beginning in block 301 of FIG. 3, upon system initialization, the system software, which in one embodiment may be the OS, may initialize the frequency lookup table 222 and table 16 with the frequency domain values and corresponding multiplier values.

In addition, the MDLL 32 may acquire and lock onto the Mem_Clk_f signal and the SDLLs 34 may receive and delay the Mem_Clk signal (block 303). More particularly, once the MDLL 32 locks, the MDLL 32 may send the delay lock value back to the control unit 22 through the control registers 223, for example. The control unit 22 may use that lock value in combination with the multiplier value in the lookup table 222 to determine the number of delay elements that the SDLLs 34 will use. The control unit 22 may send the delay values to the SDLLs 34 via the control registers 223, and the SDLLs 34 may apply the new delay values to delay the Mem_Clk signal to provide the appropriate phase offset.

In one embodiment, the memory unit 35 may run at less than full speed. Accordingly, during initialization, the memory controller 18 and the power manager 15 may participate in an initialization handshake protocol to establish a boot frequency for the memory core clock. Once the initialization sequence is complete, the memory controller 18 may notify the power manager 15 that the normal operating frequency may be used.

During normal operation, the memory system may operate at an established memory core clock frequency (block 305). As such, the control unit 22 may be configured to send the train signal to the MDLL at a normal training interval as determined by the control unit 22. However, as described above, depending on various parameters such as system utilization, performance requirements, battery voltage, and the like the OS may request a change in the frequency of the memory core clock (e.g., Mem_Clk) (block 307). If the OS requests the frequency change, the power manager 15 may assert the frequency change indication to initiate a frequency change handshake. During the handshake, the memory controller 18 may quiesce the memory interconnect 33 as described above (block 309).

The power manager 15 changes the frequency of the Mem_Clk signal and provides the frequency information to the memory controller 18 (block 311). The memory controller 18 may notify the memory PHY interface 20 of the frequency change, and provide the frequency selection information to the control unit 22 (block 313). More particularly, in one embodiment, the memory controller 18 may initiate a handshake with the memory PHY interface 20 by asserting and/or providing the asserted frequency change request signal and the frequency domain to the control unit 22 of the memory PHY interface 20.

In one embodiment, in response to receiving the frequency domain information, the control unit 22 is configured to calculate and determine the number of delay elements that the SDLLs 34 will use (block 315). As described above, the control unit 22 may use the lock value provided by the MDLL 32 to calculate a base delay value (i.e., the delay value that would be used in domain 0). The control unit 22 may then access the lookup table 222 using the frequency domain information. The control unit 22 may apply the multiplier value in the entry of the lookup table to calculate the new delay value for the SDLLs 34.

The control unit 22 may provide the new delay value to the SDLLs 34. In one embodiment, the control unit 22 may write the new delay value to the control registers 223 (block 317). The control unit 22 may send an acknowledgement back to the memory controller 18. In response, the memory controller 18 may notify the power manager 15. Operation proceeds as described above in conjunction with the description of block 305.

Figure 4:
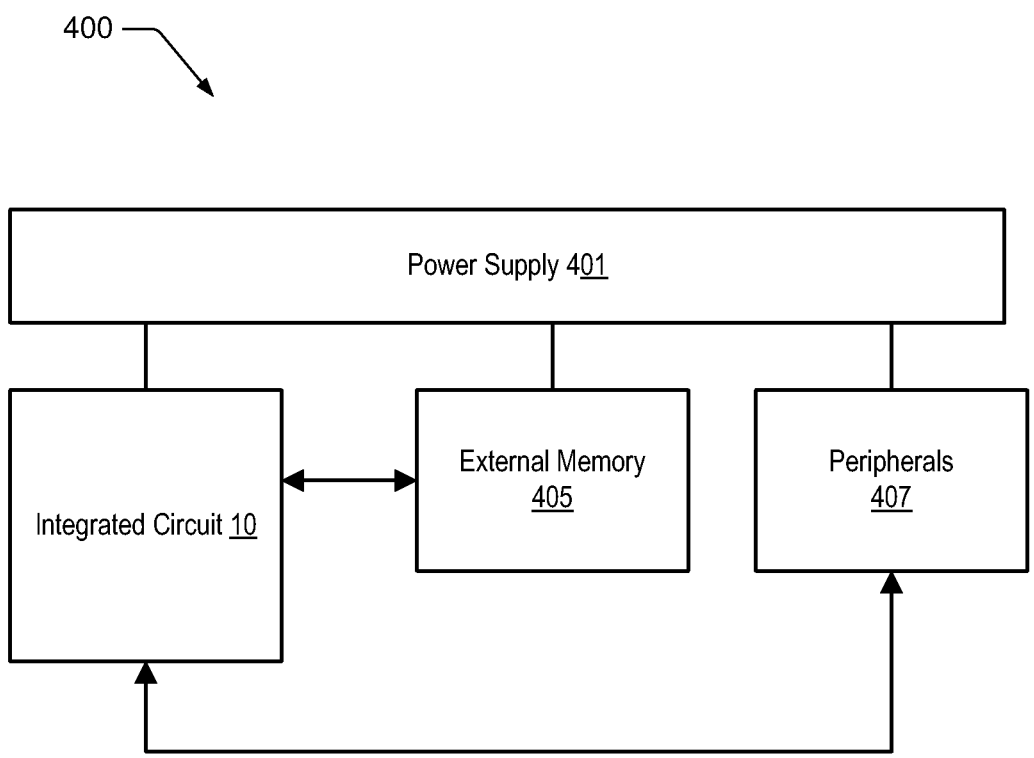
FIG. 4 is a block diagram of one embodiment of a system that includes the integrated circuit of FIG. 1.

Turning to FIG. 4, a block diagram of one embodiment of a system that includes the integrated circuit 10 is shown. The system 400 includes at least one instance of the integrated circuit 10 of FIG. 1 coupled to one or more peripherals 407 and a system memory 405. The system 400 also includes a power supply 401 that may provide one or more supply voltages to the integrated circuit 10 as well as one or more supply voltages to the memory 405 and/or the peripherals 407. In some embodiments, more than one instance of the integrated circuit 10 may be included.

The peripherals 407 may include any desired circuitry, depending on the type of system. For example, in one embodiment, the system 400 may be included in a mobile device (e.g., personal digital assistant (PDA), smart phone, etc.) and the peripherals 407 may include devices for various types of wireless communication, such as WiFi, Bluetooth, cellular, global positioning system, etc. The peripherals 407 may also include additional storage, including RAM storage, solid-state storage, or disk storage. The peripherals 407 may include user interface devices such as a display screen, including touch display screens or multitouch display screens, keyboard or other input devices, microphones, speakers, etc. In other embodiments, the system 400 may be included in any type of computing system (e.g. desktop personal computer, laptop, workstation, net top etc.).

The system memory 405 may include any type of memory. For example, as described above in conjunction with FIG. 1, the system memory 405 may be in the DRAM family such as synchronous DRAM (SDRAM), double data rate (DDR, DDR2, DDR3, etc.), or any low power version thereof. However, system memory 405 may also be implemented in SDRAM, static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a memory physical layer (PHY) unit including:
     a master delay locked loop (DLL) configured to delay a first reference clock and to provide a reference delay value corresponding to an amount of delay of the first reference clock; and
     a slave DLL configured to delay a second reference clock by a second particular amount based upon a received configuration delay value;
   an interface unit coupled to the memory PHY unit and configured to generate the configuration delay value based upon the reference delay value; and
   a power management unit coupled to the interface unit and configured to provide an indication that a frequency of the second reference clock is being changed to a new frequency in response to receiving a frequency change request;
   wherein in response to receiving the indication, the interface unit is configured to generate a new configuration delay value that corresponds to the new frequency using a predetermined scaling value and to provide the new configuration delay value to the memory PHY unit.

2. The integrated circuit as recited in claim 1, wherein the interface unit includes a control unit having a first lookup table that includes a plurality of entries, each corresponding to a different frequency of the second reference clock, wherein each entry stores a respective predetermined scaling value.

3. The integrated circuit as recited in claim 2, wherein the control unit is configured to calculate the new configuration delay value by dividing the reference delay value by a predetermined value and scaling the result using the predetermined scaling value that corresponds to the new frequency.

4. The integrated circuit as recited in claim 3, wherein the control unit includes a control register configured to update the slave DLL with the new configuration delay value in response to being written with the new configuration delay.

5. The integrated circuit as recited in claim 2, wherein the lookup table is programmable.

6. The integrated circuit as recited in claim 2, wherein the power management unit includes a second lookup table that includes a second plurality of entries, each corresponding to a different frequency of the second reference clock, wherein each entry stores a same respective predetermined scaling value as the first lookup table.

7. The integrated circuit as recited in claim 1, wherein the reference delay value corresponds to a number of delay elements used in a delay line of the master DLL to delay the first reference clock one clock cycle.

8. The integrated circuit as recited in claim 1, wherein the power management unit is configured to generate the first and the second reference clocks and to change the frequency of the second reference clock.

9. The integrated circuit as recited in claim 1, further comprising a memory controller coupled to the interface unit and the power management unit, wherein the memory controller is configured to participate in a handshake protocol with the power management unit to notify the power management unit when the memory PHY unit is ready for the frequency change.

10. The integrated circuit as recited in claim 9, wherein the memory PHY unit includes a memory interconnect including a plurality of data signal paths for connection to a memory device, wherein the memory controller is configured to complete all transactions that have been initiated on the memory interconnect prior to notifying the power management unit.

11. A method comprising:
   providing a first reference clock to a master delay locked loop (DLL);
   the master DLL delaying the first reference clock and providing a reference delay value corresponding to an amount of delay of the first reference clock;
   providing a second reference clock to a slave DLL;
   the slave DLL delaying the second reference clock by a particular amount based upon a received configuration delay value;
   an interface unit generating the configuration delay value based upon the reference delay value;
   providing an indication that a frequency of the second reference clock is being changed to a new frequency in response to receiving a frequency change request; and
   wherein in response to receiving the indication, generating a new configuration delay value that corresponds to the new frequency using a predetermined scaling value and providing the new configuration delay value to the memory PHY unit.

12. The method as recited in claim 11, further comprising storing a respective predetermined scaling value within each entry of a lookup table having a plurality of entries, wherein each respective predetermined scaling value corresponds to a different frequency of the second reference clock.

13. The method as recited in claim 12, further comprising calculating the new configuration delay value by dividing the reference delay value by a predetermined value and multiplying the result by the predetermined scaling value that corresponds to the new frequency.

14. The method as recited in claim 13, further comprising writing the new configuration delay value to a configuration register to update the slave DLL with the new configuration delay value.

15. The method as recited in claim 11, further comprising initiating a handshake in response to receiving the indication that a frequency of the second reference clock is changing.

16. An integrated circuit comprising:
   a memory physical layer (PHY) unit including:
     a master delay locked loop (DLL) configured to delay a fixed frequency reference clock and to provide a reference delay value corresponding to an amount of delay of the fixed frequency reference clock; and a slave DLL configured to delay a variable frequency reference clock by a second particular amount based upon a received configuration delay value; and an interface unit coupled to the memory PHY unit and configured to generate the configuration delay value based upon the reference delay value;

a power management unit configured to generate the fixed frequency reference clock and the variable frequency reference clock and to change the frequency of the variable frequency reference clock to a new frequency in response to receiving a frequency change request;

wherein the interface unit is configured to generate a new configuration delay value that corresponds to the new frequency and to provide the new configuration delay value to the slave DLL.

17. A mobile communications device comprising:

a memory device; and an integrated circuit coupled to the memory device, wherein the integrated circuit includes:

a memory physical layer (PHY) unit including:

a master delay locked loop (DLL) configured to delay a first reference clock and to provide a reference delay value corresponding to an amount of delay of the first reference clock; and a slave DLL configured to delay a second reference clock by a second particular amount based upon a received configuration delay value;

an interface unit coupled to the memory PHY unit and configured to generate the configuration delay value based upon the reference delay value; and a power management unit coupled to the interface unit and configured to provide an indication that a frequency of the second reference clock is being changed to a new frequency in response to receiving a frequency change request;

wherein in response to receiving the indication, the interface unit is configured to generate a new configuration delay value that corresponds to the new frequency using a predetermined scaling value and to provide the new configuration delay value to the memory PHY unit.

18. The mobile device as recited in claim 17, wherein the interface unit includes a control unit having a lookup table that includes a plurality of entries, each corresponding to a different frequency of the second reference clock, wherein each entry stores a respective predetermined scaling value.

19. The mobile device as recited in claim 18, wherein the control unit is configured to calculate the new configuration delay value by dividing the reference delay value by a predetermined value and multiplying the result by the predetermined scaling value that corresponds to the new frequency.

20. The mobile device as recited in claim 18, wherein the lookup table is programmable.

* * * * *